United States Patent
Pfeil et al.

(10) Patent No.: US 6,708,313 B2
(45) Date of Patent: Mar. 16, 2004

(54) PARALLEL ELECTRONIC DESIGN AUTOMATION: SHARED SIMULTANEOUS EDITING

(76) Inventors: Charles Pfeil, 1153 Harper Lake Dr., Louisville, CO (US) 80027; Edwin Franklin Smith, 1160 Bob Wade La., Huntsville, AL (US) 35810; Vladimir Petunin, 1429 Venice La., Longmont, CO (US) 80503; Henry Potts, 9071 Fieldcrest La., Longmont, CO (US) 80503; Venkat Natarajan, 1279 Ptarmigan Ct., Lafayette, CO (US) 80026

( * ) Notice: Subject to any disclaimer, the term of this patent is extended or adjusted under 35 U.S.C. 154(b) by 0 days.

(21) Appl. No.: 10/269,614

(22) Filed: Oct. 10, 2002

(65) Prior Publication Data

US 2003/0131332 A1 Jul. 10, 2003

Related U.S. Application Data

(60) Provisional application No. 60/341,037, filed on Dec. 10, 2001, and provisional application No. 60/340,963, filed on Dec. 10, 2001.

(51) Int. Cl.[7] ............................................... G06F 17/50
(52) U.S. Cl. .............................................. 716/1; 716/2
(58) Field of Search ....................... 716/1–2; 707/8–10, 707/101, 102, 202

(56) References Cited

U.S. PATENT DOCUMENTS

| 5,950,201 A | 9/1999 | Van Huben et al. |
| 5,983,277 A | 11/1999 | Heile et al. |
| 6,023,565 A | 2/2000 | Lawman et al. |
| 6,094,654 A | * 7/2000 | Van Huben et al. ............ 707/8 |
| 2002/0144212 A1 | 10/2002 | Lev et al. |

OTHER PUBLICATIONS

Geppert.L. *IC Design on the World Wide Web*, IEEE Spectrum. Oct. 2001. pp. 31–36.

* cited by examiner

*Primary Examiner*—Vuthe Siek
*Assistant Examiner*—Naum Levin
(74) *Attorney, Agent, or Firm*—Banner & Witcoff, Ltd.

(57) ABSTRACT

A method to simultaneously allow multiple users to edit in shared areas of a master design includes displaying the master design, allowing a first user to edit in a shared area of the design, while simultaneously allowing a second user to edit in a shared area of the design while preserving the integrity of the design 40 Claims, 14 Drawing Sheets

PARALLEL ELECTRONIC DESIGN AUTOMATION: SHARED SIMULTANEOUS EDITING

CLAIM OF PRIORITY

This application claims the benefit of U.S. Provisional Application No. 60/341,037, filed Dec. 10, 2001 and provisional application No. 60/340,963 filed Dec. 10, 2001. This application is also related to U.S. application Ser. No. 10/269,525, entitled "Parallel Electronic Design Automation: Distributed Simultaneous Editing", filed concurrently on Oct. 10, 2002.

COPYRIGHT NOTICE

A portion of the disclosure of this patent document may contain material which is subject to copyright protection. To the extent that it does, the copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © 2002, Mentor Graphics Corp., All Rights Reserved.

FIELD OF THE INVENTION

This invention relates to the field of electronic design automation tools, and more specifically, to a mechanism for giving users a shared environment for parallel printed circuit board (PCB) design.

BACKGROUND OF THE INVENTION

A PCB starts out as a schematic design in which the PCB functionality is laid out as a logical diagram of symbolic representations. When the schematic is finished, the schematic is interpreted, or captured, into a virtual PCB of physical components that make up the PCB functionality as detailed in the schematics. The PCB design can then be used to manufacture an electrical circuit in the form of a printed circuit board.

During the PCB layout process, many users may work on the schematic design to create the virtual PCB. Traditionally, this has been accomplished via a design splitting mechanism whereby each user can check out a corresponding (assigned) piece of the design to make edits to the PCB layout.

To see how edits affect the most current edits to the remainder of the board, and vice versa, the edits are merged back into the original database where the master design is updated with the edits. However, this approach is restrictive in that the user is limited to viewing only areas of the design that are opened by each individual. Consequently, the user cannot see edits that are made to the rest of the board while the user's edits are being made.

Furthermore, there is currently no known mechanism that allows users to simultaneously work in shared areas of a PCB design while maintaining the integrity of the PCB design.

SUMMARY OF THE INVENTION

In one aspect of the invention is a method for simultaneously allowing multiple users to edit in shared areas of a master design. The method includes displaying the master design, allowing a first user to edit in a shared area of the design, while simultaneously allowing a second user to edit in a shared area of the design while preserving the integrity of the design.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
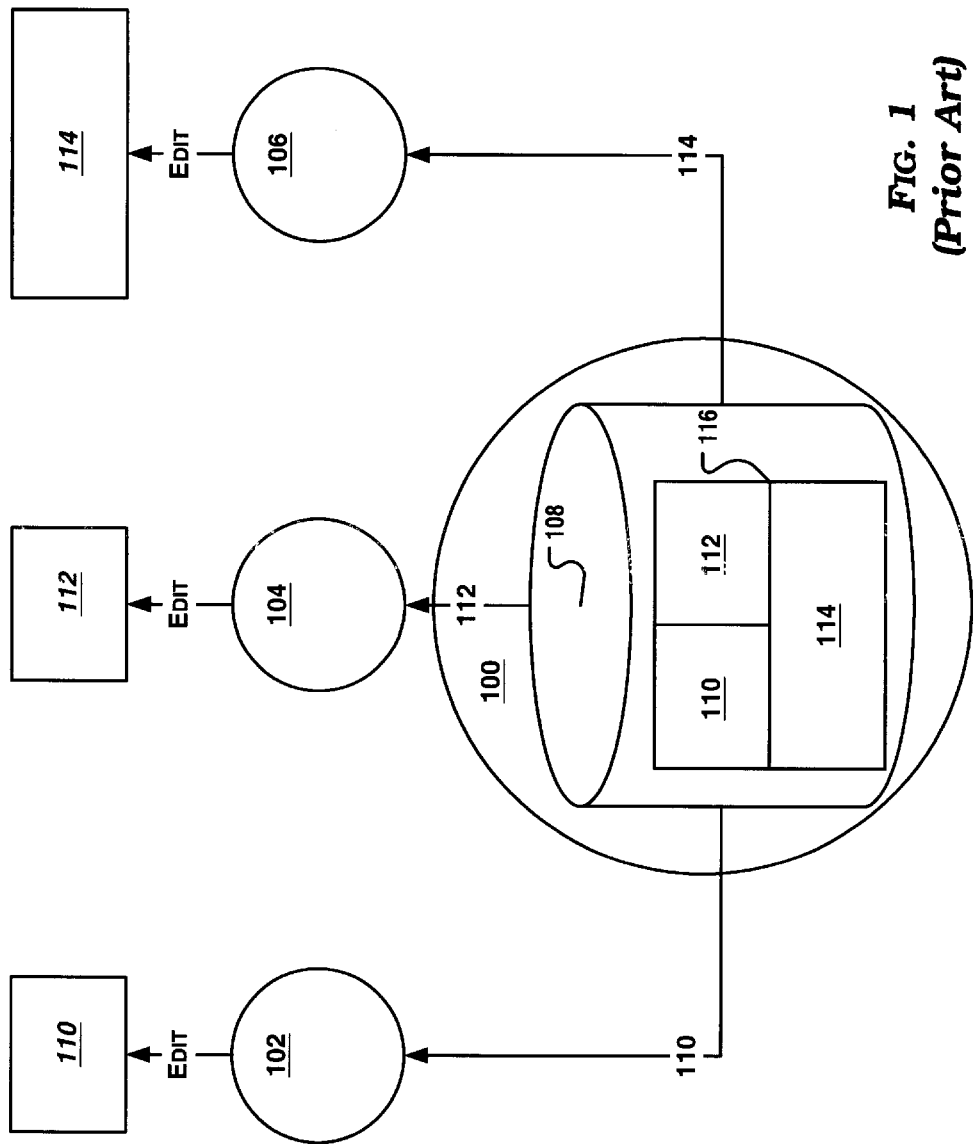
FIG. 1 is a block diagram illustrating a prior art system for PCB design, where individual sections of a master design are checked out by users.

In one aspect of the invention is a method for allowing a user to edit a PCB design concurrently with allowing the user to view edits to the PCB design by other users. Generally, the method displays a PCB design to a plurality of users. While a first user makes edits to an arbitrary section of the PCB design, a second user makes edits to an arbitrary section of the PCB design while preserving the integrity of the master design. In one embodiment of the invention, arbitrary sections may overlap, allowing each user to edit shared areas of the master design. In another embodiment of the invention, arbitrary sections are mutually exclusive, such that each user edits unshared, exclusive areas of the master design.

The present invention includes various operations, which will be described below. The operations of the present invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software.

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electromagnetic Erasable Programmable Read Only Memories), magnetic or optical cards, flash memory, or other type of media/machine-readable medium suitable for storing electronic instructions.

Moreover, the present invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Introduction

A printed circuit board design transitions through many phases before it becomes an electrical circuit. In accordance with a set of specifications, an electrical engineer creates a diagram of the circuit which maps out the functionality of the circuit using symbols. For example, a zig-zag line is used to represent a resistor. The diagram is referred to as a schematic.

In order to manufacture a printed circuit board, it is necessary to take the schematic and change it into a form of artwork that makes a pattern of components and wires, which is used in photographic imaging techniques to manufacture the PCB. The artwork is called a PCB design, and one who works on the PCB design is hereinafter referred to as a user. A user may comprise a designer who edits the PCB concurrently with other users. A user may alternatively comprise any automated program, such as an autoplacement tool, simulation tool, or an autorouter that automatically routes components on a PCB in accordance with netlines defined by a schematic. In still other embodiments of the invention, a user may comprise both a designer and an automated program. In this latter embodiment, any one or more of the users may comprise an automated program that coexists with designers for designing a board.

FIG. 1 is a block diagram that illustrates a prior art system for designing a PCB. The system comprises a plurality of clients 102, 104, 106 and a server 100, where the server 100 comprises a database 108 to store a master PCB design 116 (hereinafter "master design"), and each of the clients 102, 104, 106 enables users connected thereto to request edits to the master design 116. As used herein, a master design refers to a PCB design which can be edited by the users. Under the illustrated prior art, each user opens a unique piece 110, 112, 114 of the master design 116 to work on. A user may open a corresponding piece 110, 112, 114 of the design 116 from the database 108 and make edits to the corresponding piece 110, 112, 114 of the design 116. However, the user cannot see what edits are being made to the master design 116 by other users, and how edits to the other areas of the master design 116 affect the user's corresponding area. For example, user on client 102 edits and only sees piece 110 of the master design; user on client 104 edits and only sees piece 112 of the master design; and user on client 106 edits and only sees piece 114 of the master design.

Upon completion, or at the user's request, the corresponding piece 110, 112, 114 may be checked back into the database 108. At a later time, any of the users can check out a corresponding piece 110, 112, 114 of the master design 116 to see how the compiled, totality of edits made by all users up to that point affect the user's corresponding piece.

Figure 2:
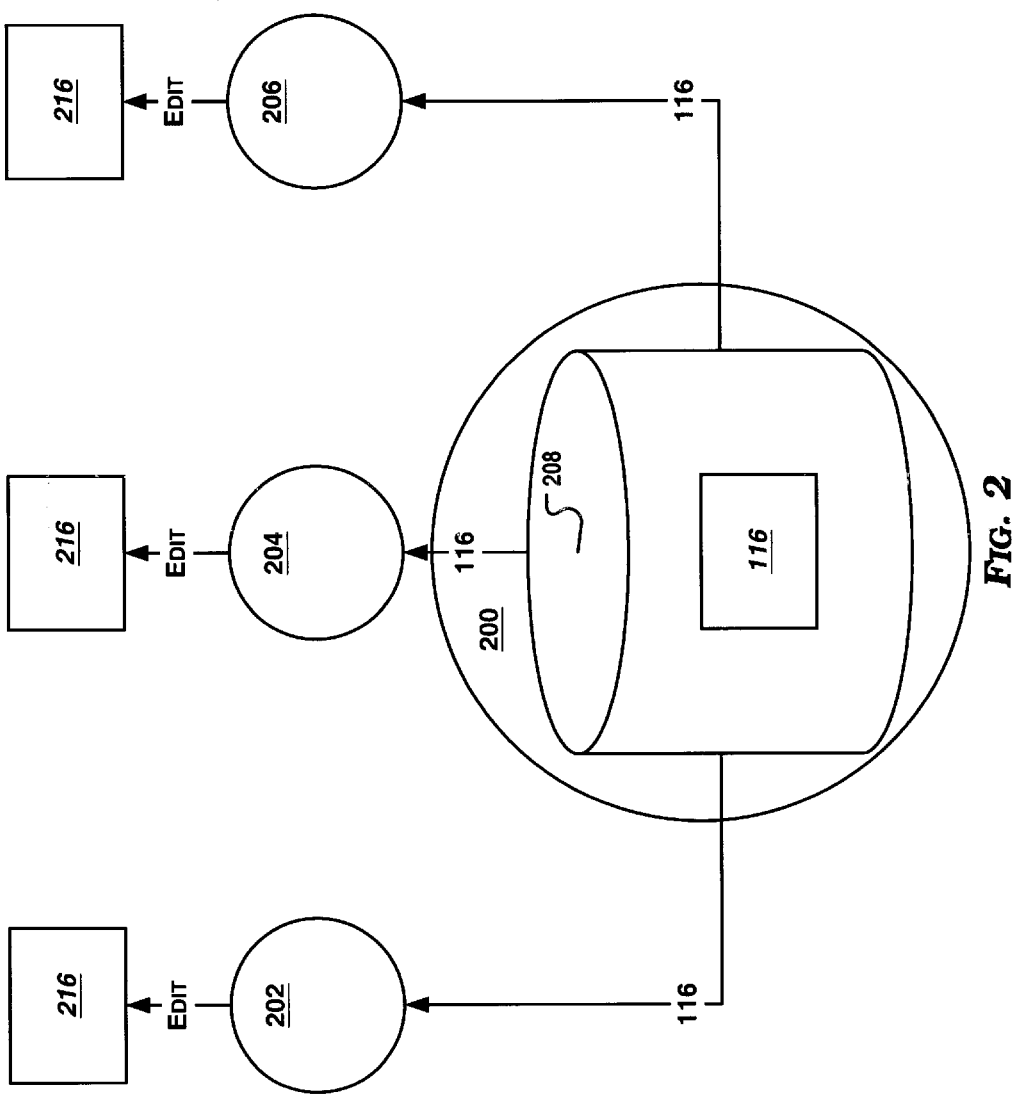
FIG. 2 is a block diagram illustrating a general embodiment of the invention, where users are given parallel access to a master design for editing.

FIG. 2 is a block diagram that illustrates a system for parallel PCB design in accordance with general embodiments of the invention. It comprises a plurality of clients 202, 204, 206, a server 200, where the server 200 has a database 208 for maintaining a master design 116.

Each client 202, 204, 206 enables users to request edits to the master design 116 in parallel with one another while viewing edits made to the master design 116 by other users. Master design 116 comprises the version on the server 200 database 208 which incorporates edit requests from clients that are accepted by the server 200, and may also be referred to as the compiled master design. Master design 216 comprises the version that is edited by a user on a given client 202, 204, 206.

When a PCB design is displayed (i.e., master design 216), it may comprise the entire PCB design, or it may comprise a partial PCB design. For instance, the master design 116 may be distributed amongst several user groups, and embodiments of the invention may be applicable to each user group, such that for a given user group, only their sections are displayed, thereby displaying only a partial PCB design. However, the sections displayed for that user group may comprise shared and exclusive areas as described herein.

A user on client 206, for example, may request edits to the master design 116, and the edit requests are submitted to the server 200. The server 200 processes the edit requests and either accepts the edit requests or rejects them. Rejected edit requests are reported back to the requesting client 206. Accepted edit requests are applied to the master design 116. Clients 202, 204, 206 can then be synchronized with master design 116.

In embodiments of the invention, parallel PCB design gives users the ability to view a compiled master design 116 while requesting edits to the master design 116. In one embodiment, one user may simultaneously edit shared areas of the master design with another user while viewing the master design 116 (shared PCB design). In another embodiment, one user may simultaneously edit unshared, exclusive areas of the master design 116 (distributed PCB design) with another user while viewing the master design 116.

An edit request may comprise a list of one or more objects and corresponding commands made by the particular user. Objects include routes, components, traces, vias, text, and drawing objects, for example; and commands include move left, move right, delete, or add, for example.

Figure 3:
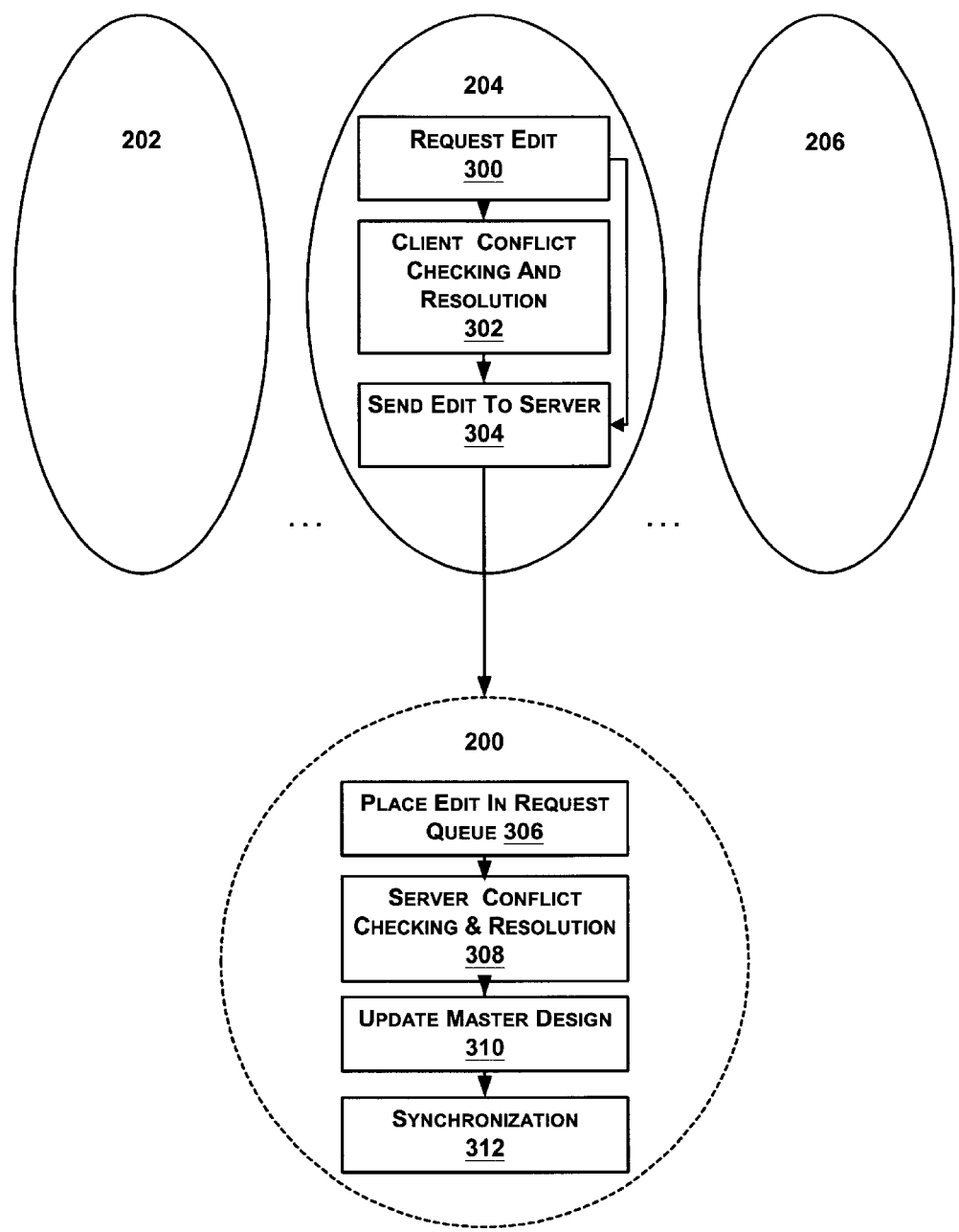
FIG. 3 is an entity diagram illustrating a general embodiment of the invention.

FIG. 3 illustrates an entity diagram. It comprises n clients 202, 204, and 206, and a server 200. A compiled master design is presented to the users. A user connected to a given client 204 makes an edit request 300 to edit the master design. If the client 204 has resources for conflict checking and resolution 302 (to be discussed), then the task is performed by the client. If client conflict checking and resolution passes, or if client conflict checking and resolution does not exist, then the edit request 300 is submitted to the server 304. If client conflict checking and resolution does not pass, then the edit request is rejected and another edit request 300 may be made.

Once an edit request 300 is submitted to the server 304, the edit request 300 is placed in a request queue 306 of the server. The request queue may comprise a FIFO (first-in-first-out) queue where edit requests submitted first are processed first; or a priority queue, where certain edit requests (i.e., types of requests, or requests from certain clients) are given priority over other edit requests, for example. When the edit request is eventually taken off the request queue, server conflict checking and resolution 308 (to be discussed) are performed on the edit request. If server conflict checking and resolution passes, then the edit is accepted and the master design is updated 310. The clients can then be synchronized with the master design 312.

The following comprise examples of how edits can be detected:

When a user moves an object, he selects it, moves it, and then releases it. An edit is detected once the object has been released.

When a user deletes an object, he selects it, and selects a delete command. An edit is detected when the delete command is selected. (The delete command may embody many variations. For example, a delete button may be selected, or the object to be deleted may be placed in a recycle bin.)

When a user adds an object, an object to be added is selected, placed on the master design, and then released. An edit is detected when the object to be added is released.

The user submits object names and commands.

Shared PCB Design

Figure 4:
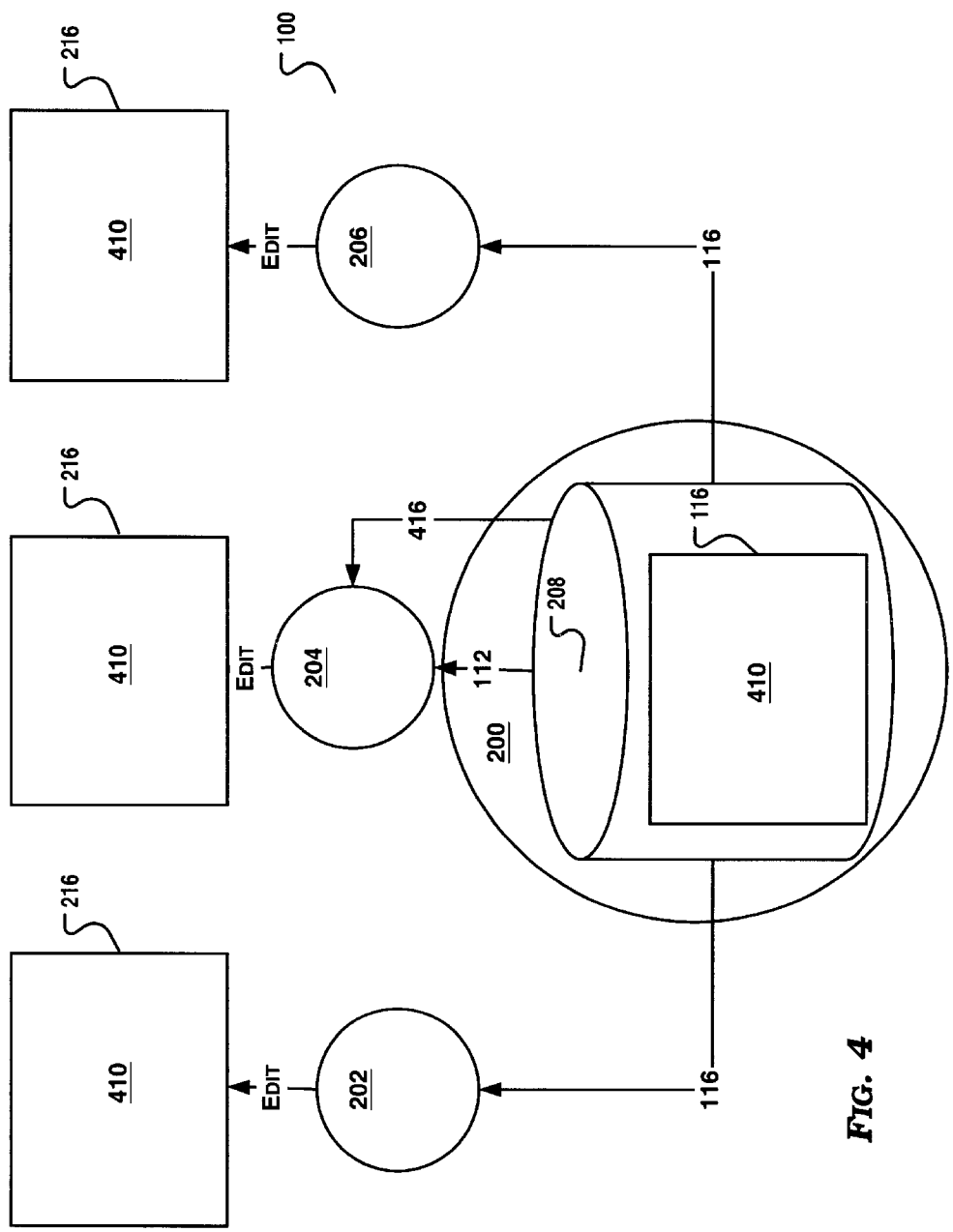
FIG. 4 is a block diagram illustrating a first embodiment of the invention, where parallel access is implemented by giving users concurrent editing access to shared areas of a master design.

In one embodiment of the invention is a shared editing system, as illustrated in FIG. 4, where a plurality of users 202, 204, 206 may simultaneously edit shared area 410 of a PCB design 116, giving each of the users shared access to the PCB design. In embodiments of the invention, shared areas comprise areas of the master design that can be accessed and edited by multiple users. On the other hand, exclusive areas are partitioned and assigned to individual users. Exclusive areas are discussed in further detail in the section entitled "Distributed PCB Design".

For purposes of illustration, it is assumed that the entire board comprises shared areas such that each of the users on the clients 202, 204, 206 can simultaneously edit and view objects in the entire master design 116, subject to access rights, discussed below. It is also contemplated that shared areas may comprise a subset of areas on a master design 116, such that the master design 116 comprises both shared and exclusive areas. In this latter scenario, edits to the master design 116 in exclusive areas are validated by a corresponding client conflict checking and resolution module; and edits to the master design 116 in shared areas may be validated by a corresponding client conflict checking and resolution module, a server conflict checking and resolution module, or both.

Figure 5:
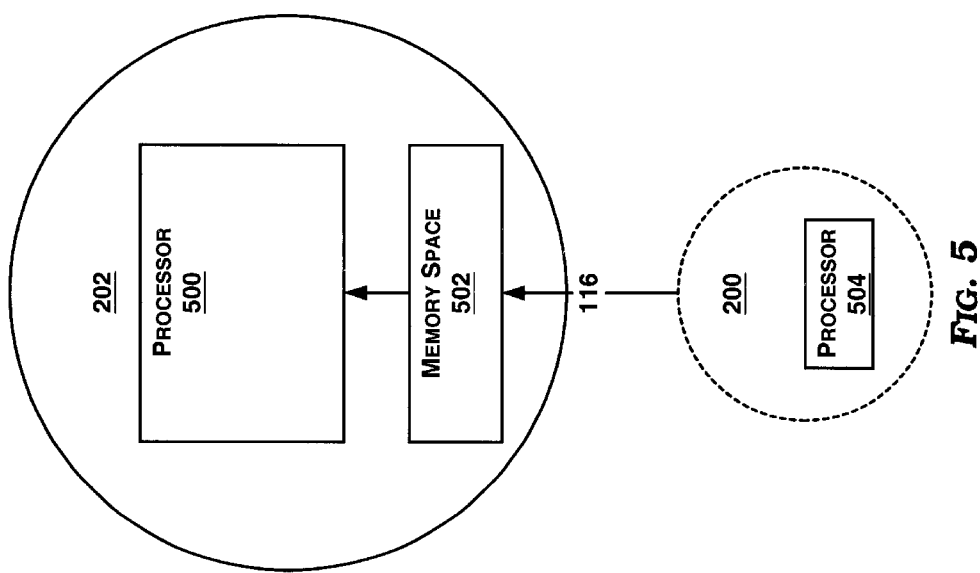
FIG. 5 is an entity diagram illustrating interaction between a client and a server in accordance with general embodiments of the invention.

In FIG. 5, a client 202 (only one shown) corresponds to a given user and comprises a processor 500 and an optional memory space 502. The server 200 comprises a processor 504 as well. While illustrated as a one-to-one client-server, and user-client relationship, it should be understood by one of ordinary skill in the art that the configuration is not to be so limited. It should be understood that any single client is merely a portal that allows a user to edit the master design 116 simultaneously with other users. Furthermore, the server 200 should be understood as an appliance for coordinating and managing the edits to the master design 116.

In one embodiment, the master design 216 comprises master design 116 on a client, such as on a thin client (i.e., client having minimal processing resources), where all edit requests are submitted to the server 200. In this embodiment, the server 200 performs all conflict checking and resolution operations to determine whether the edit requests are acceptable, to be discussed.

In another embodiment, master design 216 comprises a copy of the master design 116 in a client's memory space. In this embodiment, conflict checking and resolution operations may be performed by a processor 504 on the server 200 alone, on a processor 500 by the client 202 alone, or may be distributed in various proportions between the respective processors of a given client 202, 204, 206, and the server 200. These are described in more detail below.

Access Rights

In general embodiments of the invention, each user has access to the same aspects of the master design as any other user, subject to assignment restrictions (discussed below in "Distributed PCB Design"). In one embodiment, all users have the same access rights. For example, a first user may request edits to the same objects and commands as a second user. In another embodiment, access rights of each user may differ. For example, a first user may only request edits to components, and a second user may only request edits to routes.

Conflict Checking and Resolution

When an edit request is received, conflict checking and resolution operations are performed. Conflict checking comprises checking to prevent edits that violate one or more design rules. Design rules ensure that the design adheres to a predetermined set of rules in order to minimize the probability of fabrication defects. A design rule checker may check for spacing violations, geometry violations, and connectivity violations, for example. For example, when two traces are placed next to each other that are closer than a spacing rule, a design rule violation occurs.

Conflict resolution comprises detecting edits that may conflict, but which may be resolved. For example, if two traces are too close and violate a design rule, then one trace can be moved to resolve the conflict.

Figure 6:
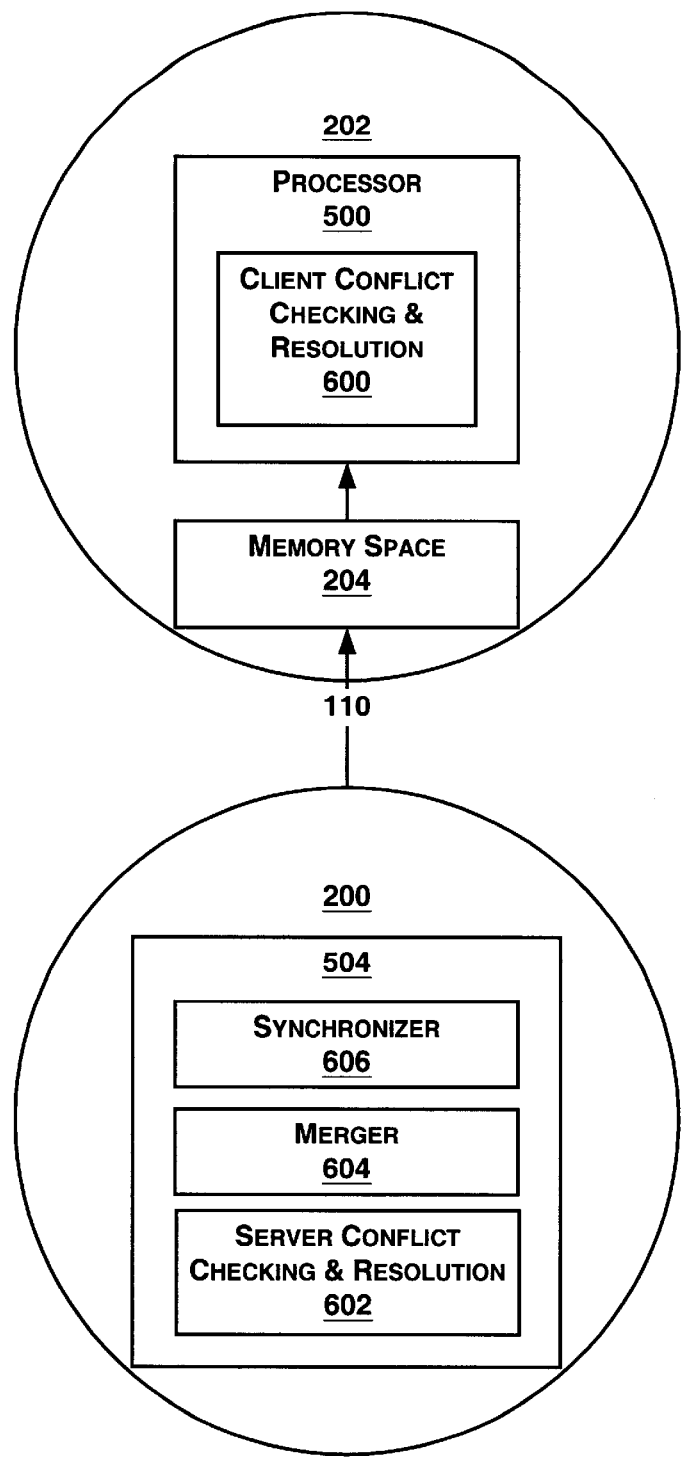
FIG. 6 is an entity diagram illustrating interaction between a client and a server in accordance with a first embodiment of the invention.

As illustrated in FIG. 6, client conflict checking and resolution and server conflict checking and resolution may coexist, or they may exist in isolation. When they coexist, a client conflict checker and resolution module 600 of a client 202 determines if the master design 216 on the client has any conflicts. If there is a conflict, it is determined if the conflict can be resolved.

If the conflict can be resolved, or if there are no conflicts, then the client conflict checker and resolution module 600 sends the edit request to the server conflict checker and resolution module 602 of the server 200 to determine if any conflicts exist with the master design 116 on the server.

If conflicts exist, then the server conflict resolution module 602 may determine if the conflicts may be resolved. If no conflicts exist, then the edit requests are accepted, and a merger unit 604 of the server 100 applies the edit requests into the master design data structure.

A synchronizer 606 of the server 200 then synchronizes the one or more clients 202, 204, 206 with the compiled master design 116. Synchronizing may comprise, for example, sending master design 116 to a single client upon request from the client; broadcasting master design 116 to all or multiple clients upon request from multiple clients; automatically swapping out a client copy of the master design data structure 216 on each of the clients 202, 204, 206 for the updated master design data structure 116 on the server 200 upon updating the master design; or automatically updating the clients' 202, 204, 206 displays upon updating the master design 116. Of course, these examples do not comprise an exhaustive list.

When conflict checking and resolution exist in isolation, either the server performs all conflict checking and resolution; or each client performs all conflict checking and resolution. The server may perform all conflict checking and resolution operations when, for example, clients are thin clients (i.e., clients having minimal processing resources), and the master design 216 on client comprises master design 116, where edit requests are submitted to the server 200. Clients may perform all conflict checking and resolution when, for example, a master design is partitioned and assigned to individual users such that no inter-client conflicts arise during editing (to be discussed in Distributed PCB Design). In this latter scenario, where edits are made in their respective exclusive areas, if any conflicts still exist after those edits are made (residual conflicts), the server may perform conflict checking and resolution operations. However, this is not necessary, as the residual conflicts may be taken care of after the edits have been applied.

When a server performs conflict checking and resolution, in cooperation with the client, or in isolation, the server may implement optimization functions to minimize its workload. For example, it may keep track of which client made the previous edit request that was merged so that if the next edit request comes from the same client, the server knows that it can eliminate certain conflict checking and resolution functions.

Conflict Prevention

Figure 7:
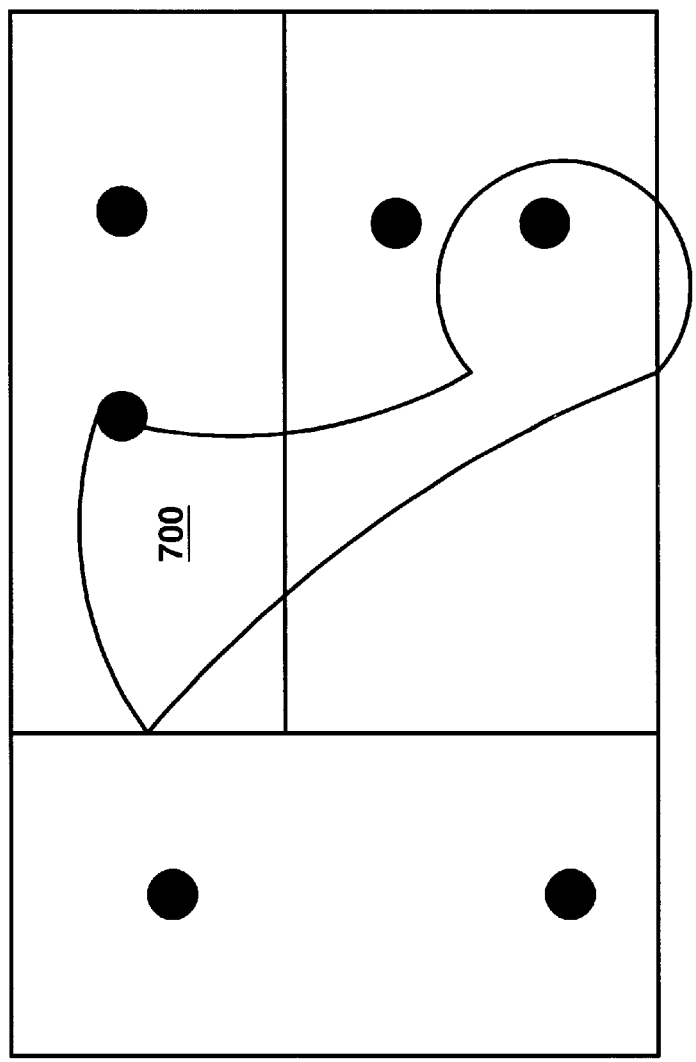
FIG. 7 is a block diagram illustrating a first conflict prevention mechanism.

To avoid conflicts from occurring in the first place, a number of conflict prevention mechanisms may be employed. One mechanism that can be used to prevent conflicts is the use of protection boundaries as illustrated in FIG. 7. A protection boundary 700 allows a user to draw a protection border around the user's workspace that temporarily reserves the area for the particular user. The protection border is broadcasted to all clients, and enables a user to edit the master design without encountering conflicts. The protection border may be removed at the user's request. If another user attempts to edit in an area contained in a protected border, a conflict checker prevents it and reports it as an error to the client on which the edit is being attempted.

Figure 8:
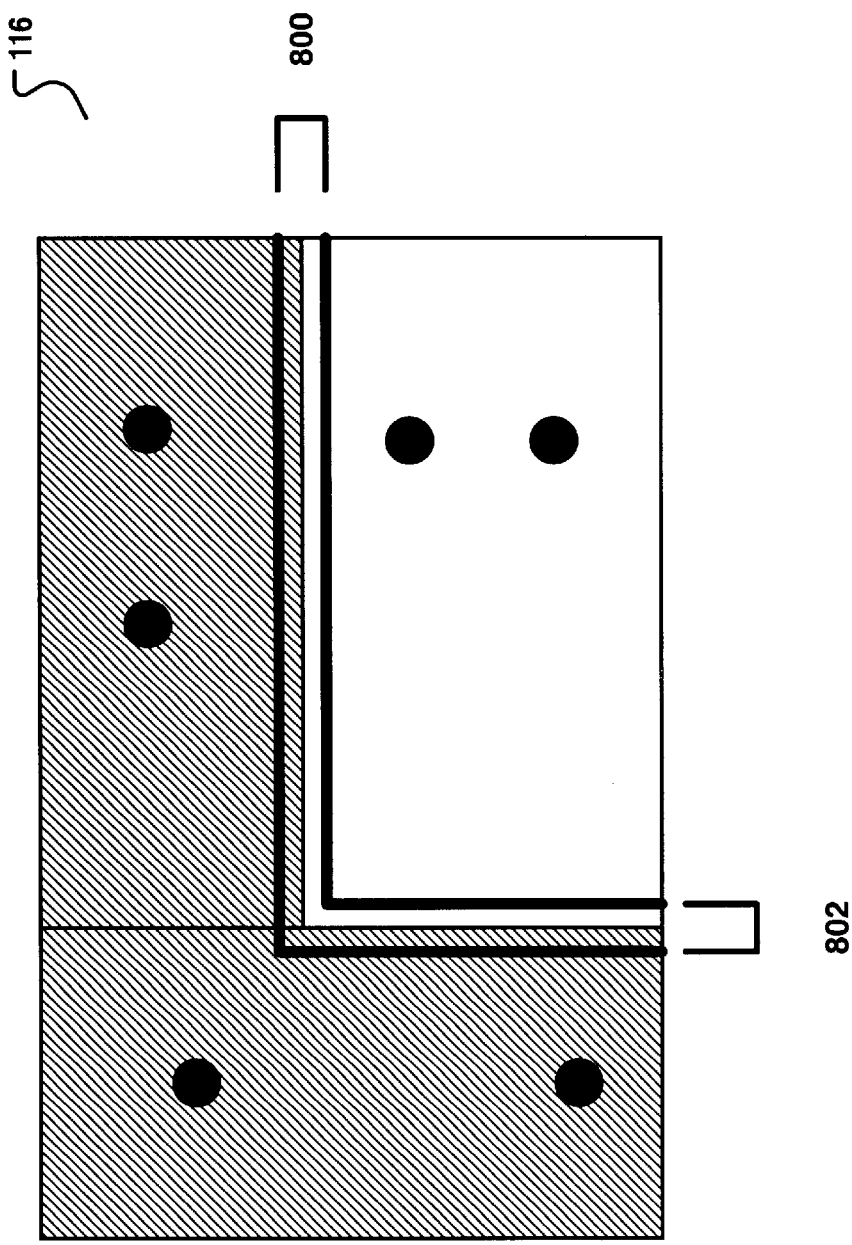
FIG. 8 is a block diagram illustrating a second conflict prevention mechanism.

As illustrated in FIG. 8, another mechanism for preventing conflicts is the use of force field widths 800, 802 along the boundaries of a user's working area to automatically provide a reasonable clearance around the working area. In one embodiment, the user's working area comprises the cursor, where a force field width is applied to the area around the cursor. In other embodiments, the working area may comprise an object closest to the cursor, where a force field width is applied to the area around the object. If another user attempts to edit within the boundaries of a working area protected by force fields, the conflict checker prevents it and reports it as an error to the client on which the edit is being attempted.

Another mechanism that can be used is object locking. Object locking entails marking an object as reserved for the client that performs the locking operation and not editable by other clients. Still another mechanism that can be used for conflict prevention is the assignment of netlines to autorouters. Assigning netlines to autorouters prevents one autorouter from routing the same netline differently.

Distributed PCB Design

Figure 9:
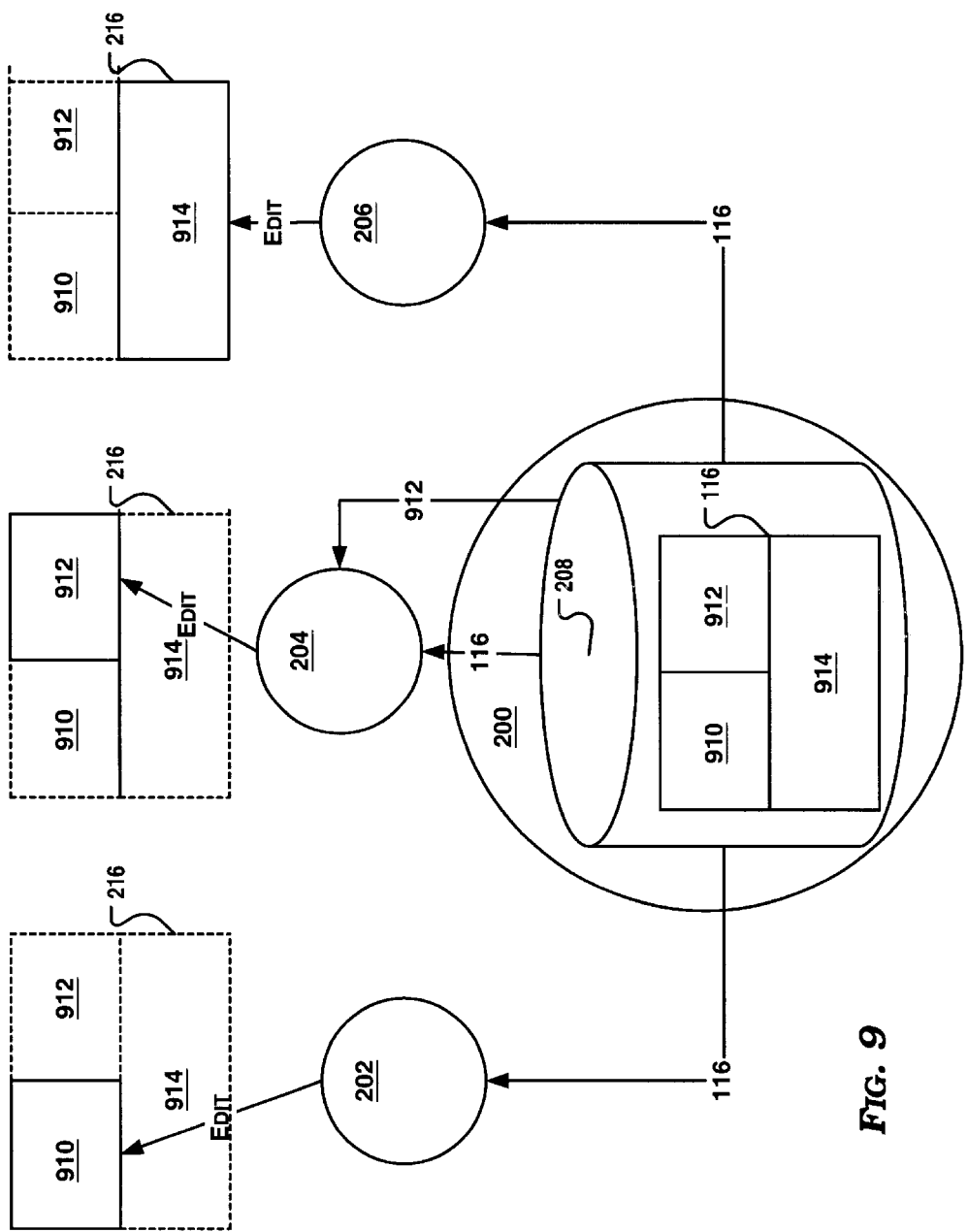
FIG. 9 is a block diagram illustrating a second embodiment of the invention, where parallel access is implemented by giving users editing access to corresponding areas of a master design, and read-only access to other areas of the master design.

FIG. 9 is a block diagram of a distributed editing system in accordance with another embodiment of the invention. The system comprises a plurality of clients 202, 204, 206, and a server 200 having a database 208 to store the master design 116. The master design comprises exclusive areas 910, 912, 914, where each exclusive area 910, 912, 914 may be viewed by all users, but edited by a single user.

Like prior art systems, each user is assigned a unique piece 910, 912, 914 of the master design 116 to work on. However, unlike prior art systems, a user can view the edits to the other pieces of the design being performed by other users concurrently with the user's editing session. For example, exclusive area 910 may correspond to a user on client 202, such that user on client 202 may edit exclusive area 910. User on client 202 is able to edit exclusive area 910, and is also able to view exclusive areas 912, 914 to view the compiled master design.

Partitioning

Partitioning is the process whereby a design is segregated into a plurality of areas. Partitioned areas may then be assigned to users, such that only an assigned user may edit that area. An exclusive area, with respect to a given user who is assigned to the exclusive area, can only be edited by the given user. The exclusive area with respect to any other user can only be viewed (i.e., is read-only) by other users.

The area boundaries may be arbitrary, and are not bound to the schematic boundaries. Partitioning may be performed by specific drawing tools that create polygons and can assign attributes such as a name, an owner, etc. to each exclusive area.

Figure 10:
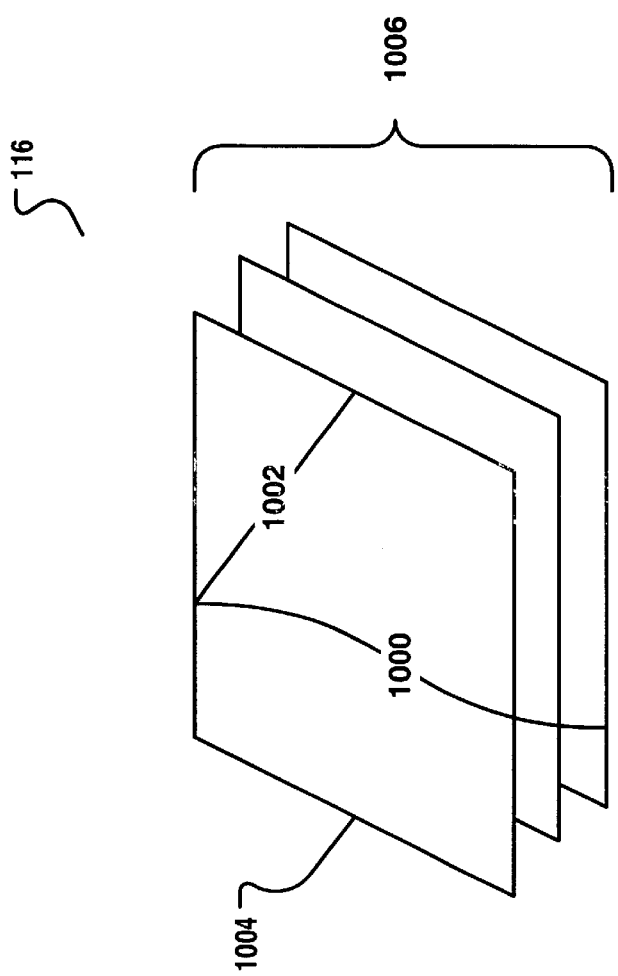
FIG. 10 is a block diagram illustrating partitioning.

In embodiments of the invention, an owner of a design partitions a design into a plurality of sections. For example, as illustrated in FIG. 10, arcs 1000 and lines 1002 may be used to partition a single layer 1004 of the design 116, or even multiple layers 1006 of the design 116. Sections may be defined by specifying a type of area (i.e., circle, rectangle, polygon); assigning one or more layers to the area; and assigning the section. Each section is then available for editing by a single user. An owner of a design may also be a user.

When a section is assigned to a user, the section becomes an exclusive area. An exclusive area is not available for editing by other users, but is available for viewing by other users. An exclusive area may be explicitly assigned whereby the owner of the design specifically assigns a given area to a specific user, or an exclusive area may be implicitly assigned whereby any area that is not explicitly assigned is assigned to the owner of the design by default. Alternatively, each area may be assigned an arbitrary name, and users may reserve areas by checking out exclusive areas on demand.

For purposes of illustration, it is assumed that the whole board is exclusive such that users on the clients 202, 204, 206 can simultaneously edit in assigned areas while viewing the compiled master design 116, subject to access rights, discussed supra. It is also contemplated that exclusive areas may comprise a subset of areas on a master design 116, such that the master design 116 comprises shared and exclusive areas. In this latter scenario, edits to the master design 116 in exclusive areas are validated by a corresponding client conflict checking and resolution module; and edits to the master design 116 in shared areas may be validated by a corresponding client conflict checking and resolution module, a server conflict checking and resolution module, or both.

Editing

Figure 11:
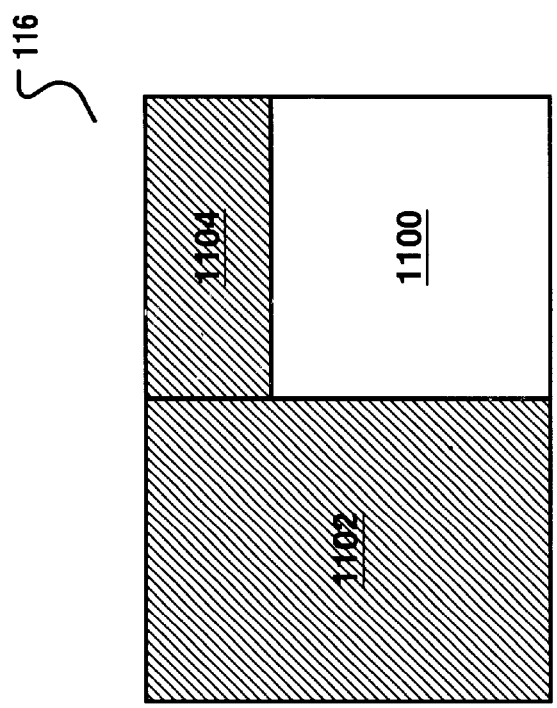
FIG. 11 is a block diagram illustrating a partitioned master design.

As illustrated in FIG. 11, when a user opens a design 116, all sections corresponding to the user 1100 (i.e., exclusive areas that are assigned to or checked out by the user), as well as shared areas, if any, are available to the user for editing, and all other non-corresponding, exclusive areas 1102, 1104 are available for viewing. In embodiments of the invention, the user may be given an option to display only the parts and routes inside the exclusive areas for the specified user. Other items such as PCB objects, drawing objects, and netlines can be displayed normally.

Any objects inside a corresponding exclusive area are available for editing, and any objects outside of a corresponding exclusive area are locked and not available for editing, but are read-only. Objects include but are not limited to routes, components, traces, vias, text, and drawing objects, for example.

Placement Rules

Placement rules help prevent conflicts that may arise during design of a section. For example, since exclusive areas may have layer restrictions, it is possible for a via, a thruhole pin, or a part to exist in multiple exclusive areas. Any object that exists in multiple areas should be locked. An object that would traverse multiple areas (by existing on multiple layers that are assigned to different users) should be prevented from being added.

Figure 12:
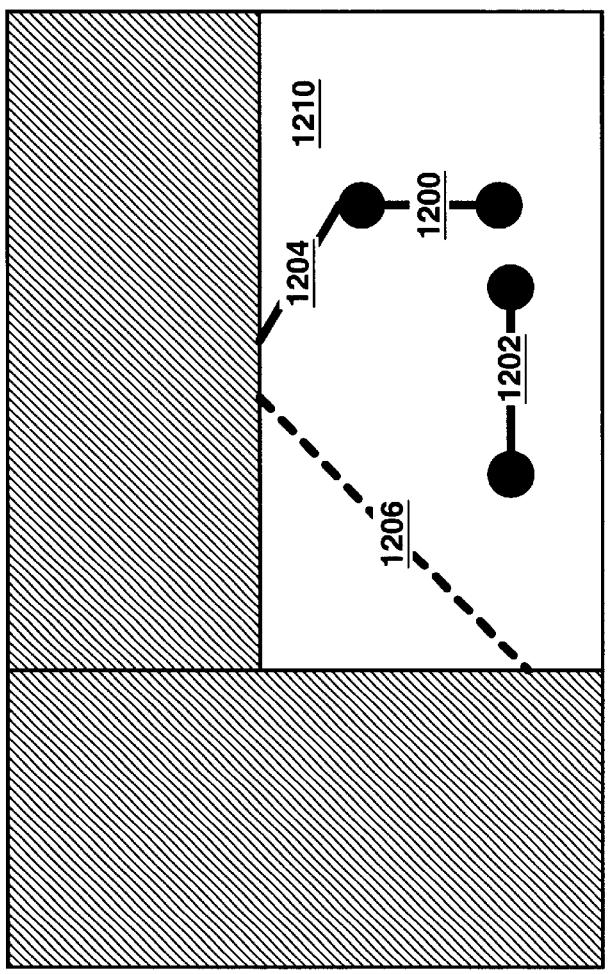
FIG. 12 is a block diagram illustrating netline connectivity when partitioning is implemented.

Furthermore, as illustrated in FIG. 12 (assuming area 1210 is an exclusive area), netlines 1200, 1202 that start inside an exclusive area, and finish inside an exclusive area may be completely routed; netlines 1204 that start inside an exclusive area, but that finish outside the exclusive area may be routed to the edge of the exclusive area. Once the netline is routed to the edge of one exclusive area, the owner of the adjacent exclusive area (or any user, if it is a shared area) may continue routing the netline in their own area. Netlines 1206 that do not start or end in an exclusive area may be restricted from routing, or may be routed with limitations. In this example, netline 1206 may be routed if its endpoints are on the edge of the exclusive area.

Figure 13:
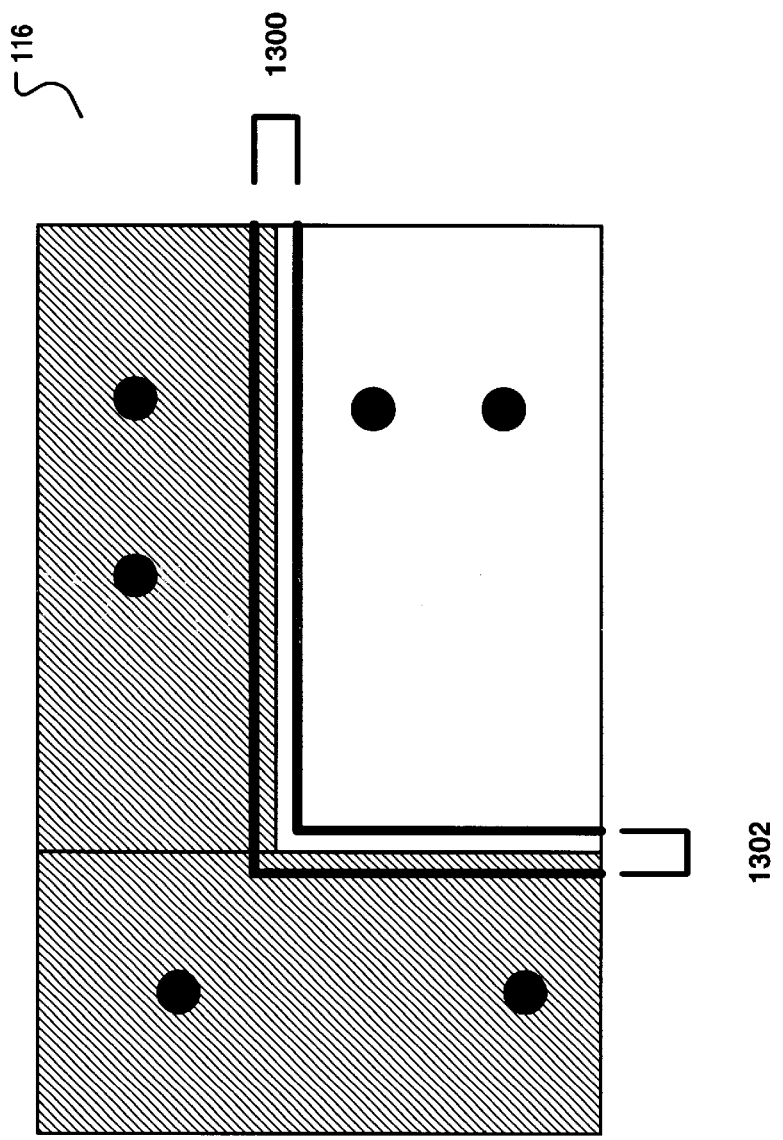
FIG. 13 is a block diagram illustrating the use of force field widths in netline connectivity.

Spacing violations may occur when traces are placed too closely to one another. (See Conflict Checking and Resolution, discussed supra.) Spacing violations are likely to occur along the boundary of two sections, or within an exclusive area. As illustrated in FIG. 13, one way to deal with spacing violations that occur along the boundary of two sections, is to allow force field widths 1300, 1302 (discussed, supra) along the boundaries. Force field widths automatically provide a reasonable clearance between objects along the boundaries, and allow users to design to the edge of an exclusive area without facing potential spacing violations.

There are various other possibilities for placement rules that are well known in the art and are not further discussed herein. The examples provided are for illustrative purposes only and are not intended to be limiting on embodiments of the invention.

Flowcharts

Figure 14:
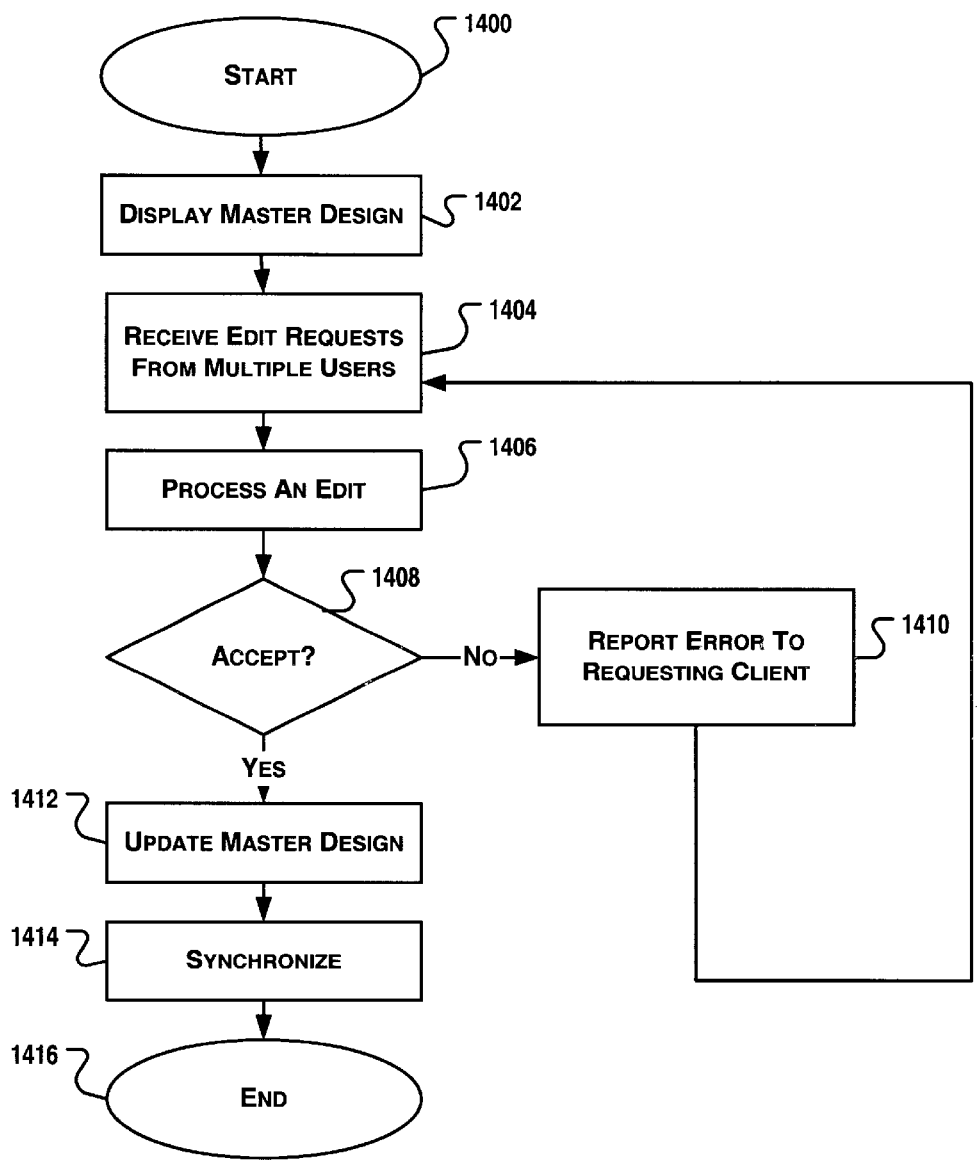
FIG. 14 is a flowchart illustrating a method in accordance with general embodiments of the invention.

FIG. 14 is a flowchart illustrating a method in accordance with general embodiments of the invention as discussed above. It begins at block 1400 and continues to block 1402 where a master design is displayed to a plurality of clients. In one embodiment, each client views the master design from the server database. In another embodiment, each client maintains a copy of the master design in the client's own memory space.

At block 1404, one or more edit requests are received from multiple users. At block 1406, a given edit request is processed. In one embodiment, an edit request is processed by subjecting the edit request to client conflict checking and resolution, prior to submitting the edit request to the server for server conflict checking and resolution, if needed. In another embodiment, the edit request is directly submitted to the server for server conflict checking and resolution.

At block 1408, it is determined if the edit request has been accepted. If the edit request passes conflict checking and resolution, then it is accepted. Otherwise, the edit request is rejected. If the edit request is accepted, then at block 1412, the master design is updated, and clients are synchronized with master design at block 1414. If the edit request is rejected, it is reported as an error to the appropriate client at block 1410. The method ends at block 1416.

Conclusion

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

For example, a master design 116 may be partitioned into areas, and the areas may then be designated as shared or exclusive, such that both shared and exclusive areas comprise sections.

What is claimed is:

1. A method for editing a printed circuit board (PCB) master design during an editing session throughout which each of first and second users may edit a PCB master design portion and view edits made to the same PCB master design portion by the other of the first and second users during the editing session, comprising:

transmitting the PCB master design portion to the first and second users at respective first and second clients for graphical display on each of said clients, the graphical displays including representations of PCB artwork corresponding to the PCB master design portion;

receiving, during the editing session, a first edit request from the first client and a second edit request from the second client;

determining if the first edit request conflicts with the second edit request;

accepting the first and second edit requests by applying the edit requests to the PCB master design;

transmitting synchronization data to the first and second clients, the synchronization data permitting update of the graphical displays on the first and second clients during the editing session to reflect the first and second edits;

receiving respective third and fourth edit requests from the first and second clients during the editing session;

determining if the third edit request conflicts with the fourth edit request;

upon determining that the third and fourth edit requests conflict, transmitting subsequent synchronization data to the first and second clients, the synchronization data permitting update of the graphical displays on the first and second clients during the editing session to reflect:

acceptance of the third edit request by application of the third edit request to the PCB master design portion, and rejection of the fourth edit request.

2. The method of claim 1, wherein:

at least one of the edit requests is automatically generated in response to selection of an object and a command, the object is at least one of a route, a component, a trace, a via, text, and a drawing object, and the command is at least one of move left, move right, delete and add.

3. The method of claim 1, further comprising:
placing the first and second edit requests in a queue; and
accepting the first and second edit requests on a first-in-first-out (FIFO) basis.

4. The method of claim 1, wherein the PCB master design portion comprises an entire PCB design.

5. The method of claim 1, wherein said determining if the first and second requests conflict comprises at least one of:
determining whether acceptance of both the first and second edit requests will violate a spacing rule,
determining whether acceptance of both the first and second edit requests will violate a geometry rule, and
determining whether acceptance of both the first and second edit requests will violate a connectivity rule.

6. The method of claim 1, further comprising:
determining if an additional edit request received from the first client conflicts with an additional edit request received from the second client;
upon determining that said additional edit requests conflict, determining if the conflict can be resolved; and
upon determining that the conflict can be resolved, accepting said additional edit requests.

7. The method of claim 1, wherein:
one of the edit requests is automatically generated in response to the first or second user selecting, moving, and then releasing a first object,
another of the edit requests is automatically generated in response to the first or second user selecting a second object and then moving the second object to a graphically represented deletion area, and
another of the edit requests is automatically generated in response to the first or second user selecting a third object, placing the third object on the displayed artwork, and then releasing the third object.

8. The method of claim 1, wherein said transmitting synchronization data comprises retransmitting the PCB master design portion to the first and second users at the respective first and second clients.

9. The method of claim 1, wherein said transmitting synchronization data comprises transmitting synchronization data simultaneously with applying an edit request to the PCB master design.

10. The method of claim 1, wherein:
said transmitting a PCB master design portion comprises transmitting a shared sub-portion for graphical display at the first and second clients and an exclusive sub-portion for graphical display at the first and second clients, and
said receiving edit requests from the first and second clients comprises receiving requests to edit the shared sub-portion, and further comprising:
receiving a request by the first user to edit to the exclusive sub-portion;
accepting the request by the first user by applying said request to the exclusive sub-portion; and
rejecting a request by the second user to edit to the exclusive sub-portion.

11. The method of claim 10, wherein said transmitting a PCB master design portion further comprises:
transmitting the shared sub-portion for graphical display on the first and second clients so as to indicate that the first and second users may edit the shared sub-portion,
transmitting the exclusive sub-portion for graphical display on the first client so as to indicate that the first user may edit the exclusive sub-portion, and
transmitting the exclusive sub-portion for graphical display on the second client so as to indicate that the second user may not edit the exclusive sub-portion.

12. The method of claim 1, further comprising:
placing, in response to an instruction from the first user, a protection boundary around a sub-portion of the PCB master design portion;
subsequently receiving a request by the second user to edit the sub-portion; and
rejecting the request by the second user based on the placement of the protection boundary.

13. The method of claim 1, further comprising:
placing a protection boundary around a sub-portion of the PCB master design portion, the sub-portion corresponding to an area surrounding a cursor on a display screen of the first client;
subsequently receiving a request by the second user to edit the sub-portion; and
rejecting the request by the second user based on the placement of the protection boundary.

14. A server for receiving and processing requests to edit a printed circuit board (PCB) master design during an editing session throughout which each of first and second users may edit a PCB master design portion and view edits made to the same PCB master design portion by the other of the first and second users during the editing session, comprising:
a database for maintaining the master design;
connections to first and second clients; and
a processor configured to:
transmit the PCB master design portion to the first and second users at the respective first and second clients for graphical display on each of said clients, the graphical displays including representations of PCB artwork corresponding to the PCB master design portion,
receive, during the editing session, a first edit request from the first client and a second edit request from the second client,
determine if the first edit request conflicts with the second edit request,
accept the first and second edit requests by applying the edit requests to the PCB master design,
transmit synchronization data to the first and second clients, the synchronization data permitting update of the graphical displays on the first and second clients during the editing session to reflect the first and second edits,
receive respective third and fourth edit requests from the first and second clients during the editing session,
determine if the third edit request conflicts with the fourth edit request,
upon determining that the third and fourth edit requests conflict, transmit subsequent synchronization data to the first and second clients, the synchronization data permitting update of the graphical displays on the first and second clients during the editing session to reflect:
acceptance of the third edit request by application of the third edit request to the PCB master design portion, and
rejection of the fourth edit request.

15. The server of claim 14, wherein:
at least one of the edit requests is automatically generated in response to selection of an object and a command, the object is at least one of a route, a component, a trace, a via, text, and a drawing object, and the command is at least one of move left, move right, delete and add.

16. The server of claim 14, wherein the processor is configured to:

place the first and second edit requests in a queue, and accept the first and second edit requests on a first-in-first-out (FIFO) basis.

17. The server of claim 14, wherein the PCB master design portion comprises an entire PCB design.

18. The server of claim 14, wherein the processor is configured to determine if the first and second requests conflict by at least one of:

determining whether acceptance of both the first and second edit requests will violate a spacing rule, determining whether acceptance of both the first and second edit requests will violate a geometry rule, and determining whether acceptance of both the first and second edit requests will violate a connectivity rule.

19. The server of claim 14, wherein the processor is configured to:

determine if an additional edit request received from the first client conflicts with an additional request received from the second client, upon determining that said additional edit requests conflict, determine if the conflict can be resolved, and upon determining that the conflict can be resolved, accept said additional edit requests.

20. The server of claim 14, wherein:

one of the edit requests is automatically generated in response to the first or second user selecting, moving, and then releasing a first object, another of the edit requests is automatically generated in response to the first or second user selecting a second object and then moving the second object to a graphically represented deletion area, and another of the edit requests is automatically generated in response to the first or second user selecting a third object, placing the third object on the displayed artwork, and then releasing the third object.

21. The server of claim 14, wherein the processor is configured to transmit synchronization data by retransmitting the PCB master design portion the first and second users at the respective first and second clients.

22. The server of claim 14, wherein the processor is configured to transmit synchronization data by transmitting synchronization data simultaneously with applying an edit request to the PCB master design.

23. The server of claim 14, wherein the processor is configured to:

transmit a PCB master design portion by transmitting a shared sub-portion for graphical display at the first and second clients and an exclusive sub-portion for graphical display at the first and second clients, accept requests by the first and second clients to edit the shared sub-portion, accept a request by the first user to edit the exclusive sub-portion, and reject a request by the second user to edit the exclusive sub-portion.

24. The server of claim 23, wherein the processor is configured to transmit a PCB master design portion by:

transmitting the shared sub-portion for graphical display on the first and second clients so as to indicate that the first and second users may edit the shared sub-portion, transmitting the exclusive sub-portion for graphical display on the first client so as to indicate that the first user may edit the exclusive sub-portion, and transmitting the exclusive sub-portion for graphical display on the second client so as to indicate that the second user may not edit the exclusive sub-portion.

25. The server of claim 14, wherein the processor is configured to:

place, in response to an instruction from the first user, a protection boundary around a sub-portion of the PCB master design portion, subsequently receive a request by the second user to edit the sub-portion, and reject the request by the second user based on the placement of the protection boundary.

26. The server of claim 14, wherein the processor is configured to:

place a protection boundary around a sub-portion of the PCB master design portion, the sub-portion corresponding to an area surrounding a cursor on a display screen of the first client, subsequently receive a request by the second user to edit the sub-portion, and reject the request by the second user based on the placement of the protection boundary.

27. A machine-readable medium having stored thereon data representing sequences of instructions which, when executed by a processor, cause the processor to perform steps comprising:

transmitting a PCB master design portion during an editing session throughout which each of first and second users may edit a PCB master design portion and view edits made to the same PCB master design portion by the other of the first and second users during the editing session, wherein:

the PCB master design portion is transmitted to the first and second users at respective first and second clients for graphical display on each of said clients, and the graphical displays include representations of PCB artwork corresponding to the PCB master design portion;

receiving, during the editing session, a first edit request from the first client and a second edit request from the second client;

determining if the first edit request conflicts with the second edit request;

accepting the first and second edit requests by applying the edit requests to the PCB master design;

transmitting synchronization data to the first and second clients, the synchronization data permitting update of the graphical displays on the first and second clients during the editing session to reflect the first and second edits;

receiving respective third and fourth edit requests from the first and second clients during the editing session;

determining if the third edit request conflicts with the fourth edit request;

upon determining that the third and fourth edit requests conflict, transmitting subsequent synchronization data to the first and second clients, the synchronization data permitting update of the graphical displays on the first and second clients during the editing session to reflect:

acceptance of the third edit request by application of the third edit request to the PCB master design portion, and rejection of the fourth edit request.

28. The machine readable medium of claim 27, wherein:

at least one of the edit requests is automatically generated in response to selection of an object and a command, the object is at least one of a route, a component, a trace, a via, text, and a drawing object, and the command is at least one of move left, move right, delete and add.

29. The machine readable medium of claim 27, comprising further instructions for performing steps comprising:

placing the first and second edit requests in a queue; and accepting the first and second edit requests on a first-in-first-out (FIFO) basis.

30. The machine readable medium of claim 27, wherein the PCB master design portion comprises an entire PCB design.

31. The machine readable medium of claim 27, wherein said determining if the first and second requests conflict comprises at least one of:

determining whether acceptance of both the first and second edit requests will violate a spacing rule, determining whether acceptance of both the first and second edit requests will violate a geometry rule, and determining whether acceptance of both the first and second edit requests will violate a connectivity rule.

32. The machine readable medium of claim 27, comprising further instructions for performing steps comprising:

determining if an additional edit request received from the first client conflicts with an additional edit request received from the second client;

upon determining that said additional edit requests conflict, determining if the conflict can be resolved; and upon determining that the conflict can be resolved, accepting said additional edit requests.

33. The machine readable medium of claim 27, wherein:

one of the edit requests is automatically generated in response to the first or second user selecting, moving, and then releasing a first object, another of the edit requests is automatically generated in response to the first or second user selecting a second object and then moving the second object to a graphically represented deletion area, and another of the edit requests is automatically generated in response to the first or second user selecting a third object, placing the third object on the displayed artwork, and then releasing the third object.

34. The machine readable medium of claim 27, wherein said transmitting synchronization data comprises retransmitting the PCB master design portion to the first and second users at the respective first and second clients.

35. The machine readable medium of claim 27, wherein said transmitting synchronization data comprises transmitting synchronization data simultaneously with applying an edit request to the PCB master design.

36. The machine readable medium of claim 27, wherein:

said transmitting a PCB master design portion comprises transmitting a shared sub-portion for graphical display at the first and second clients and an exclusive sub-portion for graphical display at the first and second clients, and said receiving edit requests from the first and second clients comprises receiving requests to edit the shared sub-portion, and comprising further instructions for performing steps comprising:

receiving a request by the first user to edit to the exclusive sub-portion;

accepting the request by the first user by applying said request to the exclusive sub-portion; and rejecting a request by the second user to edit to the exclusive sub-portion.

37. The machine readable medium of claim 36, wherein said transmitting a PCB master design portion further comprises:

transmitting the shared sub-portion for graphical display on the first and second clients so as to indicate that the first and second users may edit the shared sub-portion, transmitting the exclusive sub-portion for graphical display on the first client so as to indicate that the first user may edit the exclusive sub-portion, and transmitting the exclusive sub-portion for graphical display on the second client so as to indicate that the second user may not edit the exclusive sub-portion.

38. The machine readable medium of claim 27, comprising further instructions for performing steps comprising:

placing, in response to an instruction from the first user, a protection boundary around a sub-portion of the PCB master design portion;

subsequently receiving a request by the second user to edit the sub-portion; and rejecting the request by the second user based on the placement of the protection boundary.

39. The machine readable medium of claim 27, comprising further instructions for performing steps comprising:

placing a protection boundary around a sub-portion of the PCB master design portion, the sub-portion corresponding to an area surrounding a cursor on a display screen of the first client;

subsequently receiving a request by the second user to edit the sub-portion; and rejecting the request by the second user based on the placement of the protection boundary.

40. A method for editing a printed circuit board (PCB) master design, comprising:

receiving, for display on first and second clients, a PCB master design portion that has been transmitted to the first client and second clients for graphical display on each of said clients so as to include representations of PCB artwork corresponding to the PCB master design portion;

transmitting respective first and second edit requests from the first and second clients during an editing session throughout which each of first and second users at the respective first and second clients may edit the same PCB master design portion and view edits made to the PCB master design portion by the other of the first and second users during the editing session;

receiving synchronization data at each of the first and second clients, the synchronization data permitting update of graphical displays on the first and second clients during the editing session to reflect the application to the PCB master design portion of the first and second edit requests;

transmitting respective third and fourth edit requests from the first and second clients during the editing session; and receiving subsequent synchronization data at each of the first and second clients, the subsequent synchronization data permitting update of graphical displays on the first and second clients during the editing session to reflect, subsequent to determination of a conflict between the third and fourth edit requests:

acceptance of the third edit request by application of the third edit request to the PCB master design portion, and rejection of the fourth edit request.

* * * * *